(12) United States Patent
Wu et al.

(10) Patent No.: US 6,760,397 B2
(45) Date of Patent: Jul. 6, 2004

(54) HIGH-SPEED PROGRAMMABLE FREQUENCY-DIVIDER WITH SYNCHRONOUS RELOAD

(75) Inventors: Hongbing Wu, San Jose, CA (US); Rainer Gaithke, San Francisco, CA (US)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/213,021

(22) Filed: Aug. 6, 2002

(65) Prior Publication Data

US 2003/0095621 A1 May 22, 2003

Related U.S. Application Data (60) Provisional application No. 60/333,280, filed on Nov. 16, 2001.

(51) Int. Cl.[7] .............................................. H03K 21/00
(52) U.S. Cl. ........................................... 377/47; 377/48
(58) Field of Search ..................................... 377/47, 48

(56) References Cited

U.S. PATENT DOCUMENTS

| | | | |
|---|---|---|---|
| 5,859,890 A | * | 1/1999 | Shurboff et al. ............... 377/48 |
| 6,094,466 A | | 7/2000 | Yung et al. |
| 6,097,782 A | | 8/2000 | Foroudi |
| 6,188,288 B1 | | 2/2001 | Ragan et al. |
| 2002/0011901 A1 | | 1/2002 | Dinh et al. |

FOREIGN PATENT DOCUMENTS

EP     1 133 058 A2     2/2001

OTHER PUBLICATIONS

Vaucher et al, A Family of Low–Power Truly Modular Programmable Dividers in Standard 0.35–m$\mu$m Technology, IEEE Journal of Solid–StateCircuits, vol. 35, No. 7, Jul. 2000, pp. 1039–1045.

* cited by examiner

*Primary Examiner*—Margaret R. Wambach
(74) *Attorney, Agent, or Firm*—Aaron Waxcer (57) ABSTRACT

A programmable-divider provides a lower-speed transition signal to effect a synchronized load of a new divisor value during a safe-load period of the programmable-divider, such that the division occurs using either the prior divisor value or the new divisor value, only. A combination of in-phase and reverse-phase counter stages are used to position the divisor-independent period of each counter stage so that an edge of at least one of the lower-speed counter-enabling signals occurs during a period when all of the counter stages are in a divisor-independent period. The preferred selection of in-phase and reverse-phase counter stages also maximizes the critical path duration, to allow for the accurate division of very high speed input frequencies.

13 Claims, 6 Drawing Sheets

HIGH-SPEED PROGRAMMABLE FREQUENCY-DIVIDER WITH SYNCHRONOUS RELOAD

This invention claims the benefit of U.S. Provisional Application No. 60/333,280, filed Nov. 16, 2001.

BACKGROUND OF THE INVENTION

1. Field of the Invention

This invention relates to the field of electronic devices, and in particular to a high-speed programmable frequency-divider, or multimodulus prescaler, that can be loaded with a new divisor without disturbing the counting process.

2. Description of Related Art

Figure 1A:
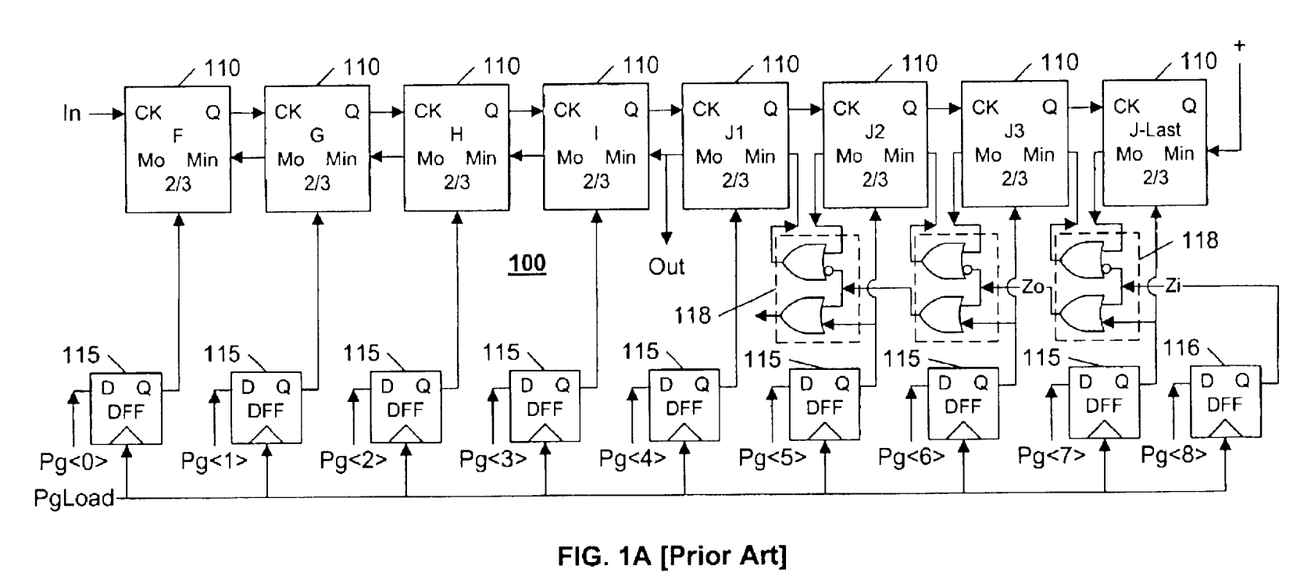
FIGS. 1A and 1B illustrates an example block diagram of a prior-art programmable divider.

FIG. 1A illustrates a conventional programmable frequency-divider 100, or multimodulus prescaler, based on the principles disclosed in "A Family of Low-Power Truly Modular Programmable Dividers in Standard 0.35-$\mu$m CMOS Technology" by Cicero S. Vaucher et al. in the IEEE Journal of Solid-State Circuits, Vol. 35, No. 7, July 2000, and incorporated by reference herein. The frequency-divider 100, divides a frequency of an input signal, In, by a programmed amount. Each counter-stage 110 is a programmable divide-by-2-or-3 counter.

Ignoring for the moment the combinatorial logic 118 that couples the last four stages J1, J2, J3, and J-Last of the divider 100, if each of the stages are configured to divide by 2, the divider 100 will divide the input frequency by $2^n$, where n equals the number of counter stages 110; in this example n equals 8. Each of the counter-stages 110 is configured to be enabled to divide by 3 once per dividing cycle; the input Min of each stage 110 provides this once-per-dividing-cycle enabling signal. When enabled, if the program input pg<x> of stage x is a logic-one, stage x divides by 3; if the input pg<x> of stage x is a logic-zero, stage x divides by 2. Division by 3 adds one extra cycle at the duration period of the particular stage. That is, for example, if the pg<3> input is a logic-one, the third stage will divide by 3 once per division cycle, adding an extra $2^3$ clock cycles to the duration of the division cycle; if pg<5> is logic-one, the fifth stage will add an extra $2^5$ clock cycles to the duration of the division cycle. The period of the division cycle of a divider 100 of length n, therefore, can be expressed as:

$$Tout = 2^n Tin + pg\langle n-1\rangle 2^{n-1} Tin + \ldots + pg\langle 1\rangle 2^1 Tin + pg\langle 0\rangle Tin, \quad (1)$$

where Tin corresponds to the input clock cycle period. Thus, absent the combinatorial logic 118 that couples the last four stages J1, J2, J3, JLast, the divisor can range between $2^n$ and $2^{n+1}-1$, which, in this case equates to a range of 256 through 511.

The combinatorial logic 118 that couples the last four stages J1, J2, J3, and J-Last provides a reduction in the effective length, n', of the divider 100, by effectively ignoring all of the upper stages beyond the most significant bit of the current programmed divisor, to produce an output period of:

$$Tout = pg\langle n\rangle 2^n Tin + pg\langle n-1\rangle 2^{n-1} Tin + \ldots + pg\langle 1\rangle 2^1 Tin + pg\langle 0\rangle Tin, \quad (2)$$

provided that the programmed divisor's most significant bit is at least at the J1, J2, J3, or J-Last position. That is, using the illustrated combinatorial logic to couple the upper k counter-stages 110, the divisor can range between $2^{n+1-k}$ and $2^{n+1}-1$. In the example, with n=8 and k=4, the divisor can range between $2^5$ and $2^9-1$, or, 32 to 511.

Equation (2) can be expressed in terms of a divisor output frequency Fout as:

$$Fout = \frac{Fin}{pg\langle n\rangle 2^n + pg\langle n-1\rangle 2^{n-1} + \ldots + pg\langle 1\rangle 2' + pg\langle 0\rangle}, \quad (3)$$

where Fin corresponds to the frequency of the input signal. Because the Min signal to each of the counter-stages F, G, H, and I occurs once per division cycle, any of these signals may be used as the output signal having the above defined output frequency. Typically, the Min signal to the I stage is used as the output signal, because it has the longest pulse duration, and therefore the lowest high-frequency component, of the stages F, G, H, and I.

As the title of the referenced article indicates, the structure of FIG. 1A is selected for modularity. Each of the counter-stages 100 of FIG. 1A are identical, and thus a redesign of the divider 100 as design rules and feature sizes change can be easily accommodated by modifying the common design of the stage 110.

Figure 1B:
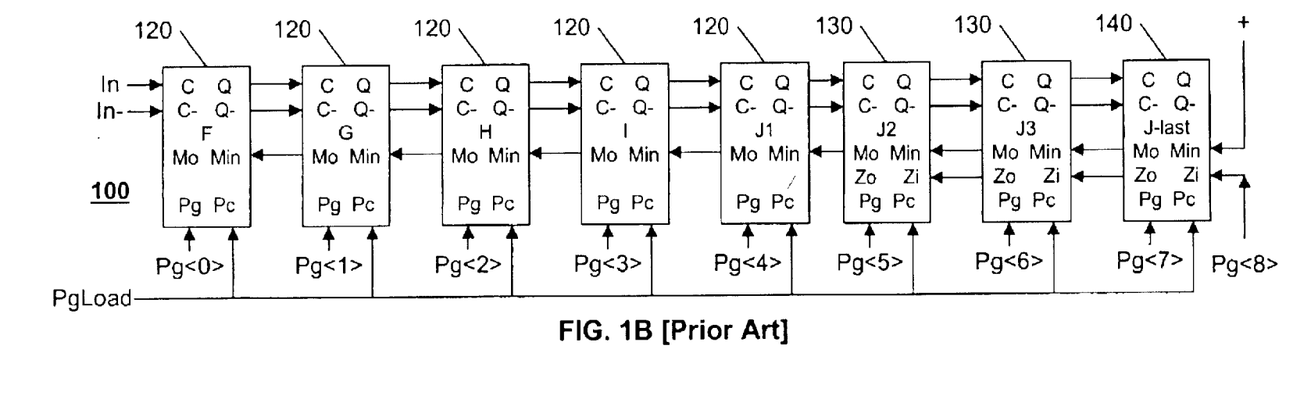
Figure 3:
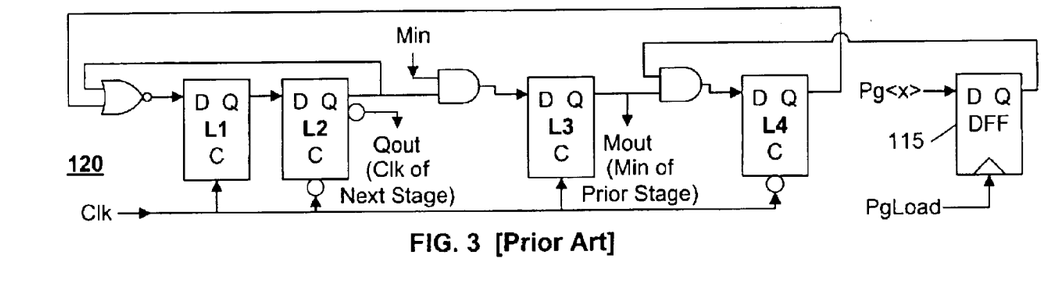
FIG. 3 illustrates an example block diagram of a prior-art counter-stage for use in a programmable divider.
Figure 10:
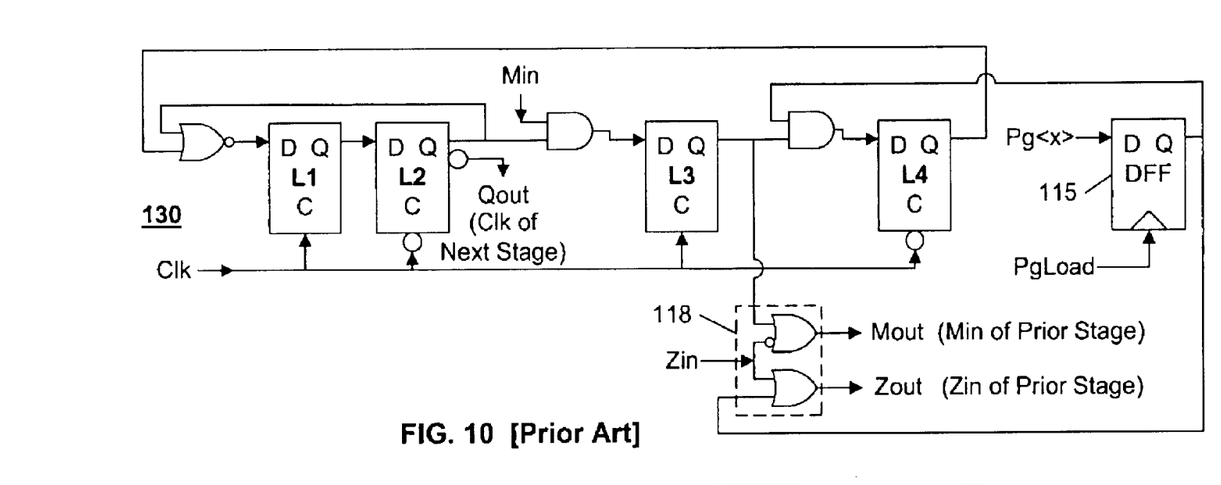
FIG. 10 illustrates an example block diagram of a prior art upper-counter-stage for a programmable divider.

For ease of subsequent reference, FIG. 1B illustrates the same programmable frequency-divider 100, having a different structural partitioning than that illustrated in FIG. 1A. In this embodiment, there are three different counter-stage modules 120, 130, and 140. Each of the modules 120 include the corresponding counter stage F, G, H, I and J 110 and associated D-flip-flop 115 of FIG. 1A that holds the program value pg<x>, and is illustrated in FIG. 3. Each of the modules 130 includes the corresponding counter-stage J2, J3 110, D-flip-flop 115, and combinatorial logic 118, and is illustrated in FIG. 10. The module 140 includes the corresponding counter stage J-Last 110, the D-flip-flops 115 and 116, and the combinatorial logic 118; the module 140 corresponds to the addition of D-flip-flop 116 to the module 130 that is illustrated in FIG. 10 to provide the input signal (Zin) to the combinatorial logic 118.

As discussed in the referenced article, a common application of the programmable frequency-divider 100 is as a frequency synthesizer for demodulating high-frequency signals, such as radio signals, including radio signals at substantially different frequency bands. In such an application, reloading or reprogramming a new divisor value corresponds to a change-of-channel to a new receiver or transmitter frequency. Because the reprogramming corresponds to a discontinuous change, there is no need to assure that the current progression of counting is not disturbed when the new divisor values pg<x> are programmed. In other applications, however, such as when used as the counting element in a fractional divider, wherein the programmed divisor repeatedly changes from a value of N to a value of N+1, then back to N, it is essential that the running count not be disturbed during each reprogramming of the divider. That is, the, divider 100 must divide by either the original divisor or the new divisor, only. If the new divisor is loaded while one or more of the stages 110 of the divider 100 is sensitive to the programmed divisor value, i.e. enabled to divide-by-three or divide-by-two, depending upon the programmed divisor value, the effective division may be a value that is neither the original divisor nor the new divisor value, because part of the count in the division cycle will be based on the original divisor, and the remainder based on the new divisor.

Figure 2:
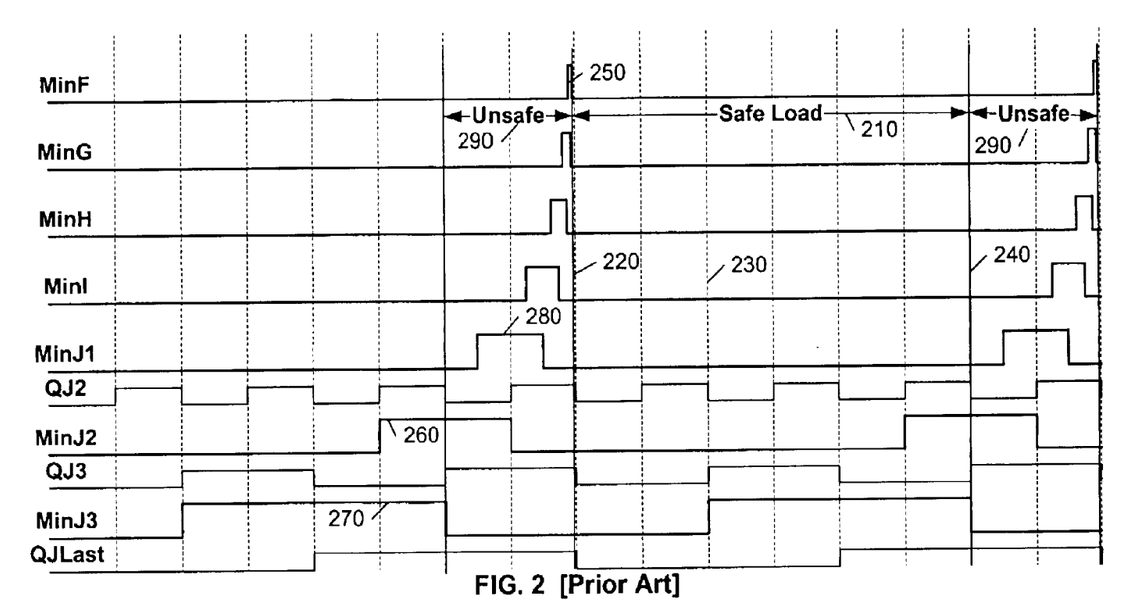
FIG. 2 illustrates an example timing diagram of signals in the prior-art programmable divider.

FIG. 2 illustrates a typical timing diagram of the divide-by-3-enable signals, MinF–MinJLast, in a conventional frequency-divider 100. Also illustrated are select outputs QJ2, QJ3, and QJLast, for timing reference. As noted above, each stage x is enabled to divide by either two or three, depending upon the stage's programmed value pg<x>, only when the incoming enabling signal, MinX, is active. In the illustrated timing diagram, the enabling signals MinF–MinJLast are active-high. A safe-load time period 210 is illustrated in FIG. 2 as commencing after all of the enabling signals MinF–MinJLast enter the inactive (low) state, at 220. Generally, the safe-load period extends at least for the duration of all the enabling signals remaining in the inactive state, at 230. If the details of the embodiment of the stages 110 are known, the extent of the safe-load period can be more precisely determined. In the conventional embodiment of a frequency-divider 100 with a counter-stage 110, for example, the safe period 210 ends when one of the enabling signals goes inactive while others remain active, or have not yet become active. As illustrated in FIG. 2, MinJ3 goes inactive at 240, while MinJ2 is still active, and each of the other enabling signals MinJ1-MinF have not yet become active. If a new program value is loaded immediately after 240, the new value will be acted upon by the stages J2-F, but not by the stages J3 and J-Last. Thus, the safe-load period 210 extends only to the end of the active period of MinJ3, at 240.

Note that, regardless of whether the safe-load period ends at 230 or at 240, the only signal that is available for synchronizing the loading of program divisor values to this safe-load period is the end of the pulse 250 of MinF that marks the start 220 of the safe-load period. The edges of signals MinJ1, Min2, and MinJ3 cannot be used, because the generation of these edges is dependent upon the programmed divisor. That is, for example, if the programmed divisor is less than 256, the MinJ3 signal does not occur in each dividing period; if the divisor is less than 128, the MinJ2 signal does not occur in each dividing period; and so on.

The pulse 250 of MinF that marks the start 220 of the safe-load period, however, is a short duration, or high-speed, pulse whose duration is equal to one clock period of the input clock frequency. As such, a high-speed circuit is required to generate a synchronized program-load signal, PgLoad of FIGS. 1A, 1B, for loading a new divisor without adversely affecting the counting process. Because high-speed circuits are generally more complex and/or more power-consuming than lower-speed circuits, most conventional frequency-dividers 100 utilize other signals (MinG, MinH, or MinI) in the divider 100 to effect the loading of a new divisor value. However, as illustrated in FIG. 2, each of the edges of the MinG, MinH, or MinI signals occurs in the Unsafe region 290, and the use of any of these signals as the program-load signal is likely to cause the loading of a new divisor while one or more of the counter-stages 110 is sensitive to the programmed divisor value. Additionally, because some of the counter-stages 110 may be enabled to use the new divisor value, and others will retain the prior divisor value, the resultant division may be substantially different from a division by either the prior divisor or the new divisor.

BRIEF SUMMARY OF THE INVENTION

It is an object of this invention to provide a high-speed programmable-divider with a relatively low-frequency synchronized divisor load. It is a further object of this invention to provide a lower-speed program-load signal for a high-speed programmable-divider that is synchronized to effect a load of a new divisor value without adversely affecting the division process.

These objects, and others, are achieved by a programmable-divider that is configured to provide a lower-speed transition signal that occurs during a safe-load period of the programmable-divider. A combination of in-phase and reverse-phase counter stages are used to position the divisor-independent period of each counter stage so that an edge of at least one of the lower-speed enabling signals occurs during a period when all of the counter stages are in a divisor-independent period. The preferred selection of in-phase and reverse-phase counter stages also maximizes the critical path duration, to allow for the accurate division of very high speed input frequencies.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions.

DETAILED DESCRIPTION OF THE INVENTION

This invention is presented using an example 8-stage programmable divider that is divided into two sets of stages, a set of four lower-order stages F–I, and a set of four upper-order stages J1–JLast, to provide a programmable division range of 32–511. As will be evident to one of ordinary skill in the art, the principles of this invention are not limited to a particular number of stages in the divider, nor to a particular partitioning, if any, between upper and lower stages in the divider.

Figure 4:
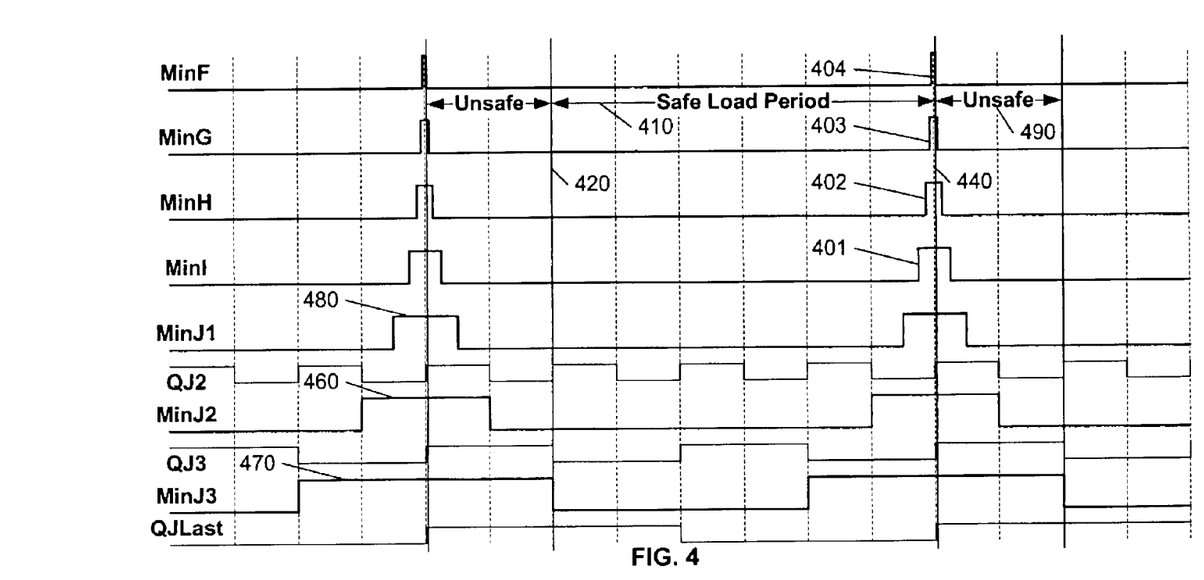
FIG. 4 illustrates an example timing diagram of signals in a programmable divider with an alternative phase-relationship between stages, as compared to the prior-art programmable divider.
Figure 5:
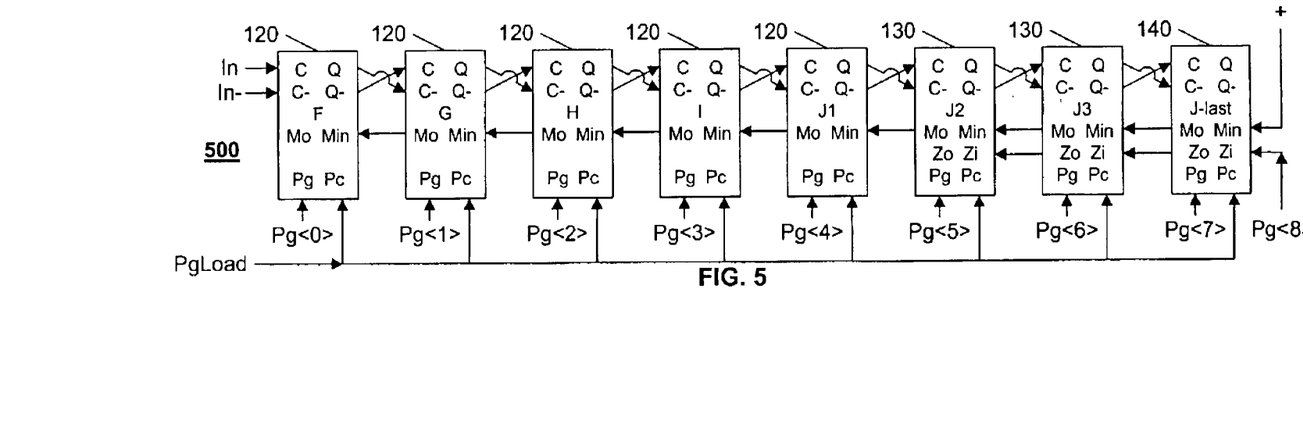
FIG. 5 illustrates an example block diagram of a programmable divider with an alternative phase-relationship between stages, as compared to the prior-art programmable divider.

FIG. 5 illustrates a programmable divider 500 with an alternative phase-relationship between stages, compared to the conventional programmable divider 100 of FIGS. 1A, 1B, and FIG. 4 illustrates a timing diagram of the divideby-three enabling signals MinF–MinJ3 of this divider 500. Each of the stages 120, 130 is coupled to its next subsequent stage via a cross-coupling of each stage's outputs Q and Q– to the next stage's clock inputs C– and C, respectively. Note that the phase relationship between each stage's output and each next stage's clock of the divider 500 is the reverse of the corresponding phase-relationship between stages of the divider 100, while all else remains the same. The effect of this alternative phase-relationship on the generation of the divide-by-three enabling signals MinJ3–MinF is illustrated in FIG. 4.

In both dividers 100 and 500, the enabling signal is propagated from the last stage J-Last to the first stage F. In the divider 100, each output enabling signal that is propagated back to a prior stage is generated at the last quarter of input enabling signal. That is, for example, the enabling signal 260 of FIG. 2 for the J2 stage, MinJ2, is generated at the last quarter of the enabling signal 270 for the J3 stage, MinJ3. Similarly, the enabling signal 280 for the J1 stage, MinJ1, is generated at the last quarter of the enabling signal 260 for the J2 state, MinJ2.

In the divider 500, with an alternative phase-relationship between counter stages, each output enabling signal that is propagated back to a prior stage is generated at the second quarter of input enabling signal. That is, for example, the enabling signal 460 of FIG. 4 for the J2 stage, MinJ2, is generated at the second quarter of the enabling signal 470 for the J3 stage, MinJ3. Similarly, the enabling signal 480 for the J1 stage, MinJ1, is generated at the second quarter of the enabling signal 460 for the J2 state, MinJ2.

The corresponding safe-load period 410 and unsafe period 410 for the divider 500 are illustrated in FIG. 4. As in the example of the divider 100, the safe period 410 begins when all of the stages are inactive, at 420. Also as in the example of the divider 100, the safe period 410 ends when one of the enabling signals goes inactive while others remain active, or have not yet become active. In the divider 500, the safe period 410 ends when the MinF signal goes inactive, at 440.

Note that a number of active edges 401, 402, 403, 404 during the safe load period 410, and any of these edges 401–404 may be used to provide the program-load signal, PgLoad, for the divider 500. Preferably, the signal MinI, with active edge 401, would be used as the PgLoad, in lieu of MinF with active edge 404, for example, because the use of the MinF signal would require a high-speed detection circuit. The high-frequency component of the MinI signal is an eighth as high as the high-frequency component of the MinF signal, and thus the DFFs 115 within the counter stages 120, 130, 140 (ref: FIGS. 3 and 5) can be a relativelylower-speed, and therefore lower-power-consuming, design.

Unfortunately, however, the divider 500 is unsuitable for very-high-speed design.

Figure 6:
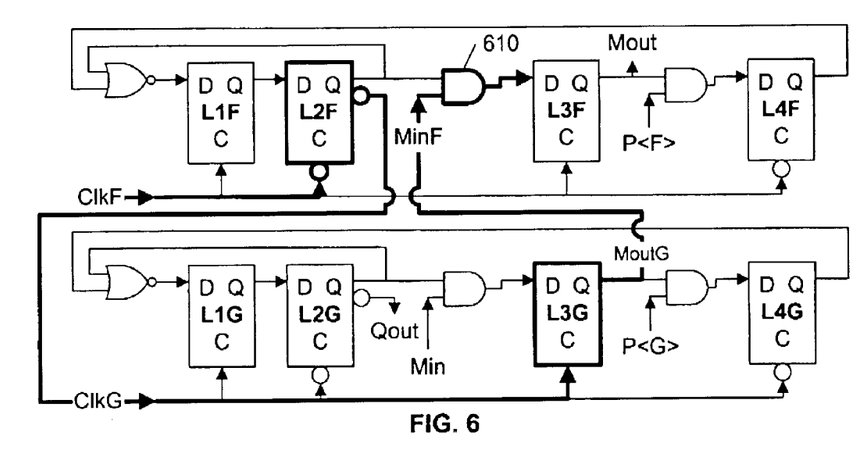
FIG. 6 illustrates a critical path analysis of the prior-art programmable divider.
Figure 7:
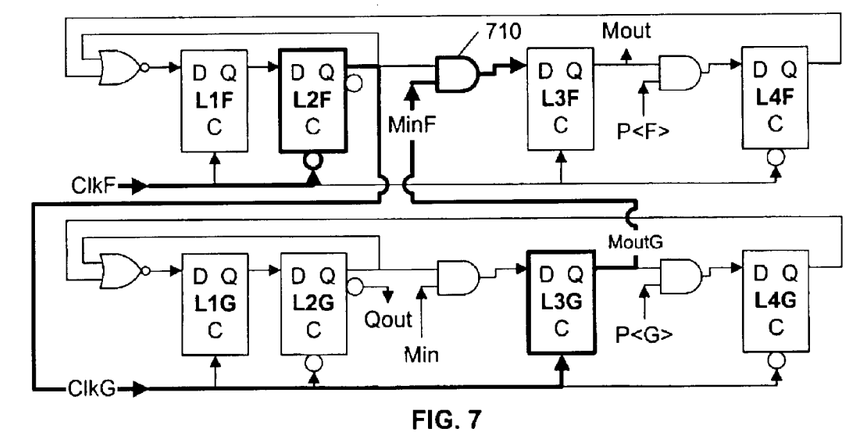
FIG. 7 illustrates a critical path analysis of the programmable divider with an alternative phase-relationship between stages.

The critical path of a divider is the path required to effect a proper divide-by-three operation at the highest speed stage (the input stage, F) of the divider. FIG. 6 illustrates the critical path of the divider 100, and FIG. 7 illustrates the critical path of the divider 500. Illustrated in each of these figures are the first two counter-stages, F and G. Because the divide-by-three enable signal for stage F is provided by stage G, while the clock for stage G is provided by stage F, the critical path includes the path required to provide the clock signal to stage G, and the subsequent propagation of the divide-by-three enabling signal to stage F, as indicated by the heavy path lines in each of FIGS. 6 and 7. Both critical paths are the same, except for the phase of the clock signal that is provided from latch L2F of stage F to the latches L1G–L4G of stage G.

With regard to the critical path of the divider 100 illustrated in FIG. 6, latch L3G is enabled when the clock, ClkG, is logic-high. This clock, ClkG, is generated from the inverted Q output of latch L2F when the input clock, ClkF, goes logic-low. Thus, when this clock is logic-high, the Q output of latch L2F is logic-low, and the gate 610 inhibits the propagation of the divide-by-three enabling signal to the latch L3F of stage F. Thus, although MinF is provided to stage F when the clock ClkF goes to logic-low, it will not be propagated to the latch L3F until the clock ClkF again goes to logic-low, one clock-cycle later, and inverts the Q output of latch L2F to a logic-high state, thereby propagating the MinF signal to the input of the latch L3F. When the clock ClkF next goes to logic-high, the enabling signal MinF is passed through the latch L3F to subsequently sensitize the latch L4F to the value of the programmed divisor input P(F). Thus, the critical path of the divider 100 is one-and-a-half clock-cycles of the input clock, ClkF, of stage F. As illustrated in FIGS. 1A and 1B, the divider input signal provides the input clock to stage F, and thus the critical path of the divider 100 must be less than one-and-a-half clock-cycles of the input to the divider 100. Alternatively stated, the highest frequency of the input to the divider 100 must be less than or equal to 1.5/(critical path length).

The critical-path operation of the divider 500 is similar, except that the clock, ClkG, is generated from the Q output of the latch L2F, and therefore the gate 710 is enabled to propagate the divide-by-three enabling signal MinF as soon as it is provided by the latch L3G in stage G. That is, soon after the input clock ClkF goes to a logic-low value, and propagates a logic-high state of ClkG, the MinF signal will be provided by the latch L3G, and available at the input to the latch L3F. Thus, when the input clock ClkF next goes to a logic-high value, the enabling signal MinF will be propagated through latch L3F, thereby sensitizing stage F of the divider 500 to the value of the programmed divisor input P(F). Thus, the critical path of the divider 500 is a mere half-clock-cycle; or, the highest frequency of the input to the divider 500 must be less than or equal to 0.5/(critical path length).

Based on the analysis above, it can be seen that the available frequency range of the divider 500 is a third of the available frequency range of the divider 100, and such a degradation in performance will generally not be acceptable to the marketplace.

Figure 9:
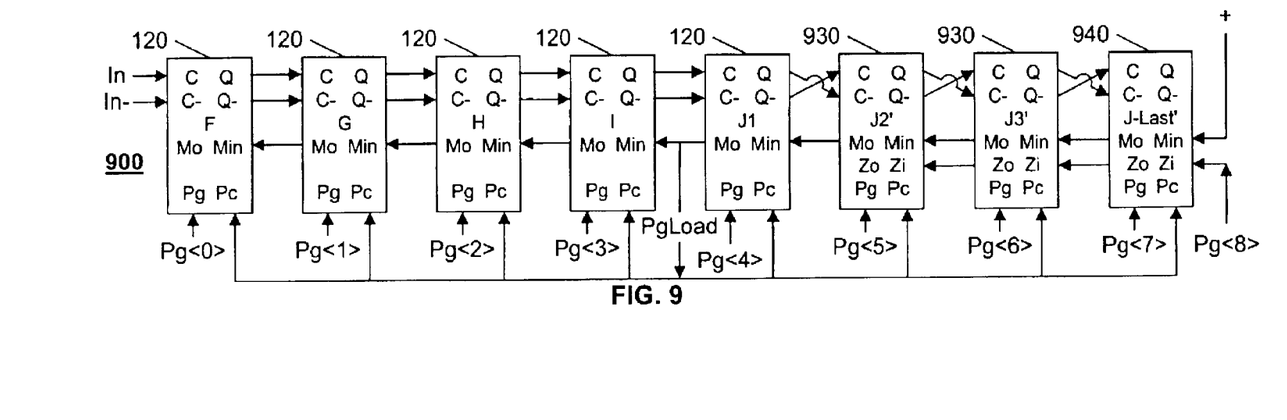
FIG. 9 illustrates an example block diagram of a programmable divider with a combination of phase-relationships between stages in accordance with this invention.

FIG. 9 illustrates an example block diagram of a programmable divider 900 that overcomes the critical path limitations of the divider 500, and overcomes the high-speed requirement for safe-loads of the divider 100. In accordance with this invention, the divider 900 is configured to operate with a combination of phase-relationships between stages. The high-speed stage F is coupled to the next stage G using the phase-relationship of the divider 100, and at least one low-speed stage is coupled to its next stage using the phase-relationship of the divider 500.

Because the coupling between stages F and G in the divider 900 is the same as the coupling provided in the divider 100, the critical path analysis of the divider 900 is the same "direct coupling" as discussed above with regard to FIG. 6. That is, with the coupling as shown in FIG. 9 between stages F and G, the maximum input frequency to the divider 900 is 1.5/(critical path length), or, three times greater than the maximum input frequency to the divider 500.

To overcome the high-speed requirement for safe-loads of the divider 100, the upper stages of the divider 900 in accordance with this invention are configured to use the "cross-coupled" phase-relationship of the divider 500. By using the alternative phase-relationship in conjunction with the conventional phase-relationship between phases, one or more active edges can be configured to occur within a safe-load period of the divider 500. In actuality, not all of the upper stages need be "cross-coupled", and not all of the lower stages need be "directly coupled". The high-speed stage F is direct coupled to stage G to increase the critical path duration, and at least one of the lower-speed stages are cross-coupled to shift the safe-load period.

As noted above, signals at each of the stages F, G, H, and I that consistently provide a once-per-division-cycle signal can be used to provide a synchronous PgLoad signal, regardless of the programmed divisor. Thus, for convenience in maintaining compatibility with prior-art divisor applications, each of the stages F through I is "directly coupled" to its corresponding next-stage. Preferably, an input signal at the higher-order stage, I, is used, because this signal will generally have a lower high-frequency component than the signals in the lower-order stages.

Figure 11:
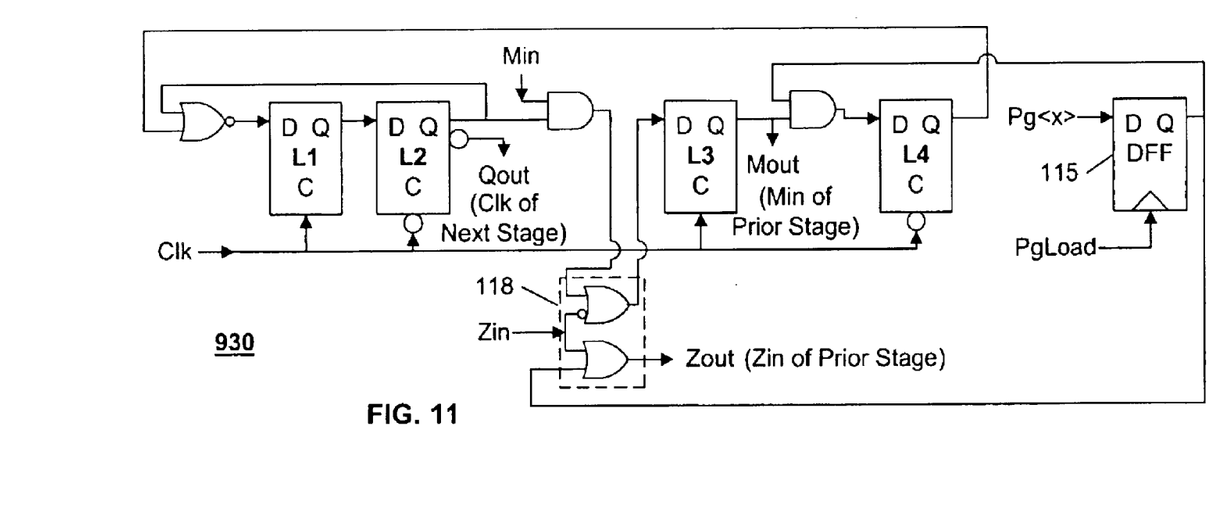
FIG. 11 illustrates an example block diagram of an upper-counter-stage in accordance with this invention.

Also illustrated in FIG. 9 is the use of stages J2', J' 930, and JLlast' 940, which are modified forms of the conventional stages J2, J3, and JLast of the divider 100. The last stage 940 corresponds to the stage 930 with the additional D-flip-flop 116 of FIG. 1. Stage 930 is illustrated in FIG. 11. As illustrated, as compared to the conventional stage 130 of FIG. 10, the combinatorial logic 118 of stage 930 is connected to the input of the latch L3, rather than to the output of latch L3 in stage 130. By placing the logic 118 on the input side of latch L3, the control input Zin is isolated from the control output Zout by a clocked latch, thereby synchronizing the propagation of the control signals to allow the divisor to be changed, during the safe-load period, without affecting the ongoing division.

Figure 8:
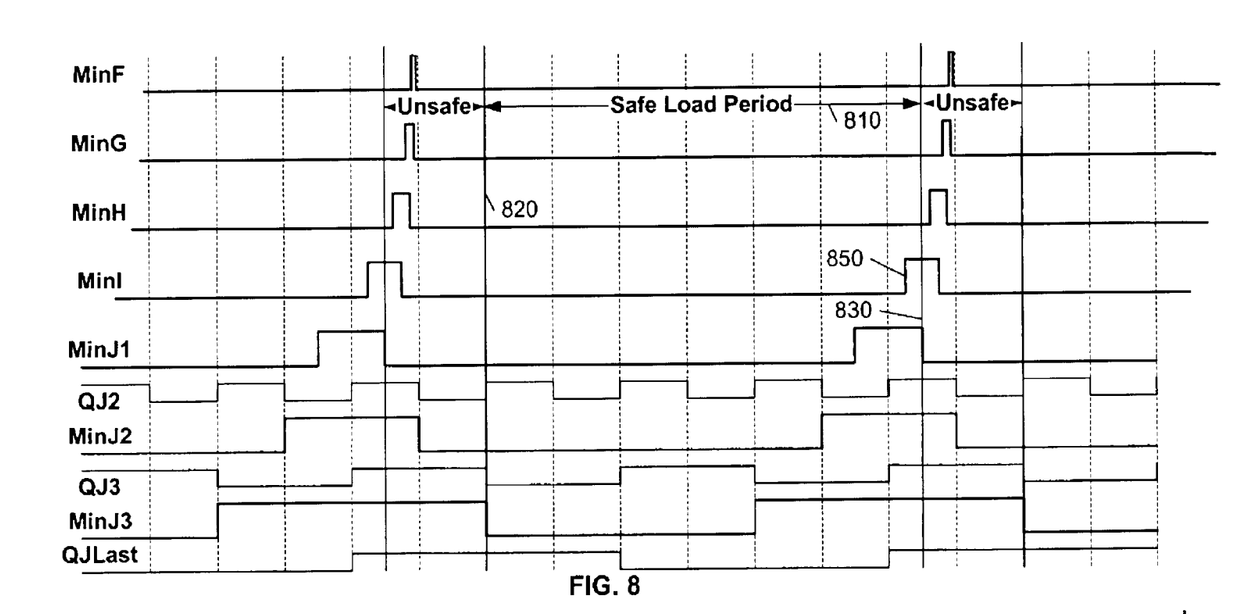
FIG. 8 illustrates an example timing diagram of signals in a programmable divider with a combination of phase-relationships between stages in accordance with this invention.

FIG. 8 illustrates an example timing diagram of signals in a programmable divider 900 with a combination of phase-relationships between stages in accordance with this invention. The illustrated divide-by-three enabling signals, MinJ1–MinJ3 that are provided to each of the stages J1 (110) through J3 (130) of FIG. 9 correspond to cross-coupled phase relationships between the outputs of each stage and the input of each subsequent stage, as detailed above with regard to the stages of the divider 500. The illustrated divide-by-three enabling signals MinF–MinI that are provided to each of the stages F (120) through I (120) of FIG. 9 correspond to the directly-coupled phase relationships between the outputs of each stage and the input to each subsequent stage, as detailed above with regard to the divider 100.

As illustrated, the safe-load period 810 begins at 820, when all of the divide-by-three enabling signals MinI through MinJ3 are inactive. The safe-load period 810 ends when one of the enabling signals, MinJ1, goes active-then-inactive again, while one or more of the other enabling signals are still active, or yet to become active again.

Of particular note, within the safe-load period 810, an active edge 850 occurs on the enabling signal MinI. As noted above, the MinI signal operates at an eighth of the frequency of the MinF signal, and is thus considered a relatively low-speed signal in the context of the maximum frequency of the divider 900. This relatively low-speed signal, MinI, is used as the program load, PgLoad, signal to load any new divisor value into the divider 900, as illustrated in FIG. 9.

Each of the D-Flip-Flops 115 in the stages 120, 130, 140 that are used to receive and store the divisor value, therefore, can be designed as relatively low-speed, and therefore low-power-consuming devices.

Because the active edge 850 of the MinI signal occurs during the safe-load period, it is assured that the counting process of the divider 900 will not be affected by the load, except that the next divisor cycle will be based on the newly loaded divisor value, as desired. That is, in the divisor cycle before the new divisor is loaded, the division factor will be the prior divisor, and in the next divisor cycle after the new divisor is loaded, the division factor will be the new divisor, with no intermediate division factors being introduced. Additionally, because the MinF signal is propagated based on a direct coupling of stages F and G, the maximum input frequency to the divider 900 of this invention is not degraded, compared to the conventional divider 100 of the prior art.

The foregoing merely illustrates the principles of the invention. It will thus be appreciated that those skilled in the art will be able to devise various arrangements which, although not explicitly described or shown herein, embody the principles of the invention and are thus within its spirit and scope. For example, the block diagrams illustrate the logical operation of the dividers, and the counter stages. As is common in the art, logical equivalences may be employed to optimize the performance of the designs. For example, in a preferred embodiment, NOR gates are used with inverted inputs, in lieu of the AND gates, to eliminate an inversion delay in each stage, as well as to reduce the "headroom" requirement (the number of stacked devices between a power source and the output of a gate). These and other system configuration and optimization features will be evident to one of ordinary skill in the art in view of this disclosure, and are included within the scope of the following claims.

We claim:

1. A programmable-divider that receives an input signal at a first frequency and provides an output signal at a second frequency, a ratio of the first frequency to the second frequency being based on a programmed divisor value, the programmable-divider comprising:

a plurality of counter-stages, operably connected to each other in series, such that an output of each counter-stage provides an input to a subsequent counter-stage, wherein:

each counter-stage, of the plurality of counter-stages is configured to effect a division of a frequency of the input to the counter-stage by either a first factor or a second factor to produce the output of the counter-stage, based on a value of a corresponding subset of the programmed divisor value, and the output of at least one counter-stage of the plurality of counter-stages provides the input to its subsequent counter-stage in an in-phase relationship with the output of the at least one counter-stage, and the output of at least one other counter-stage of the plurality of counter-stages provides the input to its subsequent counter-stage in a reverse-phase relationship with the output of the at least one other counter-stage:

wherein each counter-state of the plurality of counter-stages is configured to effect the division by either the first factor or the second factor based also on an enabling signal that is provided by its subsequent stage.

2. The programmable-divider of claim 1, wherein each counter-stage is further configured to receive a load signal that effects a load of the corresponding subset of the programmed divisor value, and the programmable-divider is configured to provide the load signal at a time when each counter-stage is configured to effect the division by the first factor only, independent of the programmed divisor value.

3. The programmable-divider of claim 1, wherein each counter-stage is further configured to receive a load signal that effects a load of the corresponding subset of the programmed divisor value, and the programmable-divider is configured to provide the load signal at a time when each counter-stage is configured to effect the division by the first factor only, independent of the programmed divisor value.

4. The programmable divider of claim 1, wherein the in-phase relationship provides a first critical path duration, the reverse-phase relationship provides a second critical path duration, a high-speed phase relationship corresponds to:
  the in-phase relationship, if the first critical path duration is longer than the second critical path duration, or
  the reverse-phase relationship, if the first critical path duration is not longer than the second critical path duration, and a first counter-stage that receives the input signal to the programmable-divider is coupled to its subsequent counter-stage via the high-speed phase relationship.

5. The programmable-divider of claim 1, wherein the programmable-divider is configurable to provide an effective counter-length that is shorter than the plurality of counter-stages, the at least one other counter-stage is also configured to receive a control input and provide a control output, the control input and output being configured to control the effective counter-length, and the at least one other counter-stage provides the control output from the control input via a clocked device.

6. A counter-stage for use in a programmable-divider having a maximum counter-length and is configurable to provide an effective counter-length that is less than the maximum counter-length, the counter-stage comprising a counter that is configured to selectively toggle an output signal, based on an enabling signal, and control logic that is configured to provide the enabling signal and a control output, based on a programmable value and a control input, the control input and the control output being configured to control the effective counter-length, wherein the control logic includes at least one clocked device that isolates the control input from the control output.

7. The counter-stage of claim 6, wherein the counter selectively toggles the output signal to divide a clock signal by either two or three.

8. A multimodulus prescaler, comprising:

a first plurality of counter-stages that are each configured to effect either a divide-by-two or divide-by-three operation, based on a first subset of a programmed divisor value, and a second plurality of counter-stages, coupled in series to the first plurality of counter-stages, that are each configured to effect either a divide-by-two or divide-by-three operation, based on a second subset of a programmed divisor value, wherein the first plurality of counter-stages are each coupled in series to each other via a first phase-relationship, and the second plurality of counter-stages are each coupled in series to each other via a second phase-relationship that is opposite to the first phase-relationship.

9. The multimodulus prescaler of claim 8, wherein each counter-stage of the first and second plurality of counter-stages is configured to receive the first and second subsets of the programmed divisor value upon receipt of a load signal, and the multimodulus prescaler is configured to provide the load signal when each of the first plurality of counter-stages is configured to effect the divide-by-two operation, independent of the programmed divisor value.

10. The multimodulus prescaler of claim 9, wherein the first plurality of counter-stages is coupled in series to a first counter-stage of the second plurality of counter-stages, and the load signal is provided by the first counter-stage of the second plurality of counter-stages.

11. The multimodulus prescaler of claim 8, wherein the first phase-relationship is characterized by a first critical path duration, and the second phase-relationship is characterized by a second critical path duration that is substantially shorter than the first critical path duration.

12. A method of dividing a first frequency of an input signal to produce an output signal at a second frequency, comprising:

selectively enabling each counter-stage of a plurality of counter-stages to effect a division by a first factor or a second factor, depending upon a programmed divisor value, and providing an output of the division from each counter-stage as an input to a subsequent counter-stage, wherein the output of the division from a first set of counter-stages is provided in a first phase-relationship, and the output of the division from a second set of counter-stages is provided in a second phase-relationship that is opposite to the first phase relationship.

13. The method of claim 12, also including loading the programmed-divisor value at a time when each of the plurality of counter-stages is enabled to effect the division independent of the programmed divisor value.

* * * * *